(12) United States Patent
Takata et al.

(10) Patent No.: US 6,518,652 B2
(45) Date of Patent: Feb. 11, 2003

(54) SEMICONDUCTOR PACKAGE

(75) Inventors: Yasuki Takata, Tokyo (JP); Hiroshi Horibe, Tokyo (JP); Kazunari Michii, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/808,151

(22) Filed: Mar. 15, 2001

(65) Prior Publication Data

US 2002/0027279 A1 Mar. 7, 2002

(30) Foreign Application Priority Data

Sep. 4, 2000 (JP) ........................................ 2000-266631

(51) Int. Cl.$^7$ ............................................. H01L 23/495
(52) U.S. Cl. ........................................ 257/676; 257/666
(58) Field of Search ................................. 257/666, 676

(56) References Cited

U.S. PATENT DOCUMENTS

| | | | | |
|---|---|---|---|---|
| 5,696,033 A | * | 12/1997 | Kinsman | ..................... 29/593 |
| 5,977,616 A | * | 11/1999 | Schoenfeld et al. | ......... 257/666 |
| 6,054,754 A | * | 4/2000 | Bissey | ......................... 257/532 |
| 6,124,150 A | * | 9/2000 | Corisis | ......................... 438/118 |

FOREIGN PATENT DOCUMENTS

| | | | |
|---|---|---|---|
| JP | 8-148518 | 6/1996 | |
| JP | 08264706 A | * 10/1996 | ........... H01L/21/60 |
| JP | 10-242373 | 9/1998 | |
| JP | 11-54685 | 2/1999 | |

* cited by examiner

Primary Examiner—Allan R. Wilson
(74) Attorney, Agent, or Firm—Leydig, Voit & Mayer, Ltd.

(57) ABSTRACT

A semiconductor package includes a semiconductor chip, a die pad, an adhesive, metal wires, LOC inner leads, and standard inner leads sealed within a sealing resin. The LOC inner leads and the standard inner leads are arranged in the same plane and both are arranged along one side of the semiconductor chip. Clearance between the inner leads and the die pad larger than the total thickness of the semiconductor chip and the bonding material. Thus, a semiconductor chip having electrode pads broadly distributed can be employed and the section modulus of the semiconductor package can be increased.

6 Claims, 12 Drawing Sheets

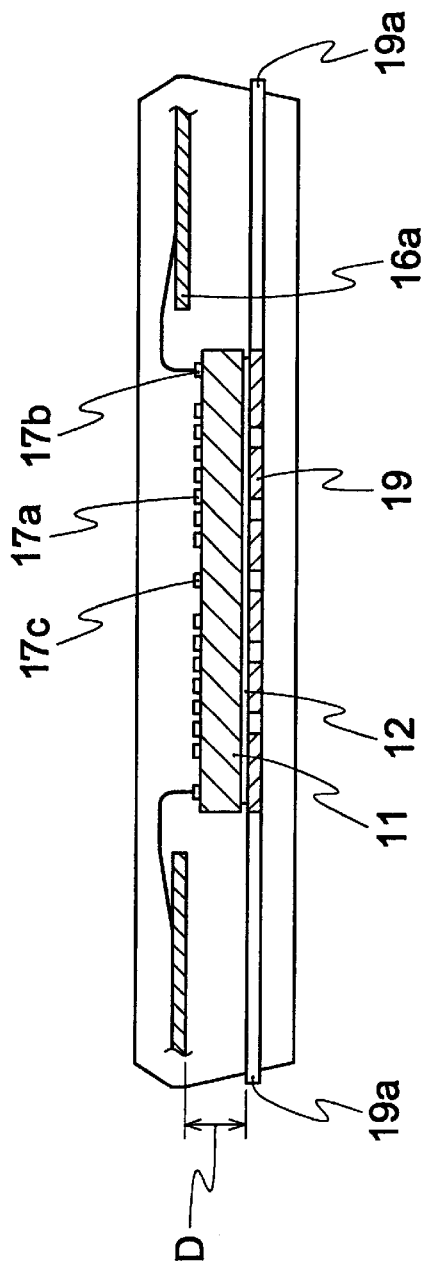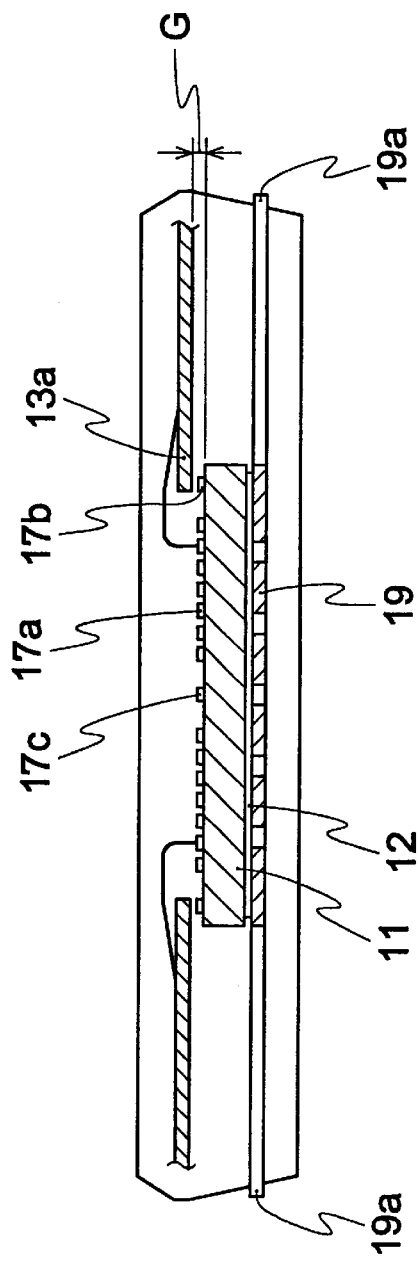

PRIOR ART

SEMICONDUCTOR PACKAGE

BACKGROUND OF THE INVENTION

The present invention relates to a semiconductor package, and more particularly to a semiconductor package comprising Lead on Chip type inner leads and standard type inner leads.

FIG. 16 is a plan view showing a conventional semiconductor package which has been disclosed in Japanese Unexamined Patent Publication No. 10-242373(1998), for example. In FIG. 16, a sealing resin of the semiconductor package is illustrated in a two-dotted chain line. FIG. 17 is a sectional view taken along a line XVII—XVII in FIG. 16 and FIG. 18 is a sectional view taken along a line XVIII—XVIII in FIG. 16. In FIG. 16, central electrode pads 7a are arranged on the center of a upper surface of a semiconductor chip 1 and LOC type inner leads 3a are extended to the upper surface of the semiconductor chip 1. Each central electrode pad 7a is electrically connected to a respective LOC type lead 3a through a metal wire 4. Moreover, peripheral electrode pads 7b are formed around the upper surface of the semiconductor chip 1 and standard type inner leads 6a are arranged on the outside of the outer periphery of the semiconductor chip 1. Each peripheral electrode pad 7b is electrically connected to a respective standard type inner lead 6a through the metal wire 4. The term "a LOC (Lead on Chip) type inner lead" means an inner lead extended to a upper surface of a chip, while "a standard type inner lead" means an inner lead arranged on the outside of the periphery of the chip and not extended to the upper surface.

In a conventional semiconductor package, the LOC type leads 3 are bent and displaced by S in their upper direction and fixed to the semiconductor chip 1 with an adhesive tape or adhesive 2, as shown in FIG. 17.

On the other hand, as shown in FIG. 18, the standard type inner leads 6a are provided on the outside of the outer periphery of the semiconductor chip 1 and on a plane lower, by a bent portion S, than a plane on which the LOC type inner leads 3a are formed. Each standard type inner lead 6a is electrically connected through the metal wire 4 to the respective electrode pad 7b provided on the upper surface of the semiconductor chip 1. The semiconductor chip 1, the adhesive 2, the LOC type inner leads 3a, the standard type inner leads 6a and the metal wires 4 are sealed with a sealing resin 5.

In the conventional semiconductor package constituted as described above, since the semiconductor chip 1 is supported with the LOC type leads 3 through the adhesive 2, a volume ratio of the semiconductor chip 1 to the sealing resin 5 can be enhanced. More specifically, a semiconductor chip having a great size can be sealed in a sealing resin having a small volume. On the other hand, each section shown in FIGS. 17 and 18 is constituted by only the semiconductor chip and the sealing resin. Therefore, a modulus of section of the semiconductor package as a combined beam is small, thus a stress caused by an outer load increases.

The sealing using a resin is carried out using a mold, and the semiconductor package is pushed out of the mold using eject pins. When eject pin receiving portions 8 of the sealing resin shown in FIG. 16 are pushed up by the eject pins (not shown) so as to remove the semiconductor package from the mold, stress on the semiconductor chip is increased if the section modulus is reduced. Moreover, since the size of semiconductor chips is being reduced from year to year, resulting in a greater reduction in the sectional modulus and an increasing stress is applied to the semiconductor chip.

Furthermore, the conventional semiconductor package requires a region coated with the adhesive 2 on the upper surface of the semiconductor chip 1 in order to adhere the LOC type leads 3, and the electrode pads 7 cannot be provided in the region coated with the adhesive 2. For this reason, the area on the chip 1 for arranging the electrode pads 7 is restricted to the central region (for the central electrode pads 7a) and the peripheral regions (for the peripheral electrode pads 7b) along shorter sides where the standard type leads 6 are provided. Thus, there has been a drawback in that the region on the upper surface of the semiconductor chip where the electrode pads 7 are to be provided is limited to a small I-shaped region.

Furthermore, since the LOC type leads 3 and the standard type leads 6 are processed down to a working limit, each modulus of section in thickness and width directions is small and a bending rigidity is also small. Moreover, since tips of the LOC type leads 3 and tips of the standard type leads 6 are provided on different planes, they are easily deformed when being taken out of or accommodated in a delivery magazine during a delivery or an inspection at an assembling step.

In the conventional semiconductor package shown in FIG. 16, the S bend of LOC type lead 3 must be located at a region in which the leads 3 are arranged rectilinearly, in parallel, in the vicinity of the outer leads 3b extending from the sealing resin. If the S bend of the LOC type lead 3 is located at a region in which the leads 3 are arranged obliquely, spacing between tips of the adjacent LOC type inner leads 3a easily becomes uneven so that the tips of the adjacent leads come in contact with each other or necessary space cannot be obtained. In the conventional semiconductor package shown in FIG. 16, leads 6 on four corners have no bent portion and other leads 3 are bent so that the leads 6 and the leads 3 are not in the same plane. Accordingly, there have been drawbacks in that a high working cost for bending is required and leads must be handled carefully so as not to be deformed.

The structure of the conventional semiconductor package described above is suitable for a simple function semiconductor device incorporating a standardized chip such as an ordinary DRAM or SRAM chip. However, with the above-mentioned conventional structure, a semiconductor chip of high function having a large size and electrode pads distributed and arranged on its whole upper surface, e.g. a chip in which a DRAM cell, a SRAM cell and a peripheral circuit cell are integrated, cannot be constituted as a semiconductor package.

SUMMARY OF THE INVENTION

In order to solve the above-mentioned drawbacks, it is an object of the present invention to provide a semiconductor package which incorporates a high-function semiconductor chip, such as one wherein a DRAM cell, a SRAM cell and a peripheral circuit cell are integrated, having electrode pads distributed and arranged on its whole upper surface.

It is another object of the present invention to provide an inexpensive and high-quality semiconductor package wherein LOC type inner leads and standard type inner leads are arranged on a single plane and electrically connected to electrode pads on a semiconductor chip through metal wires.

Moreover, the semiconductor chip is enlarged through an increase in a memory capacity and an addition of functions. Correspondingly, the outer dimension of a sealing resin is increased. Consequently, when the semiconductor package is to be removed from a mold, a bending moment generated in the central part of the semiconductor package is increased. It is yet another object of the present invention to provide a semiconductor package having a high rigidity which is resistant to the great bending moment, especially the sealing resin is at a high temperature immediately after a sealing step.

In order to achieve the above-mentioned objects, the present invention provides a semiconductor package in which a semiconductor chip, a die pad, a die bond material fling the semiconductor chip on the die pad, LOC type inner leads having their tips extended above the semiconductor chip and metal wires connecting the tips of the LOC type inner leads to electrode pads on the semiconductor chip are sealed with a sealing resin, wherein outer leads formed successively to the inner leads are protruded outwardly from the sealing resin.

Moreover, the present invention provides a semiconductor package in which standard type inner leads and metal wires connecting the tips of the standard type inner leads to electrode pads on the semiconductor chip are further sealed with the sealing resin, wherein outer leads formed successively to the standard type inner leads are protruded outwardly from the sealing resin, and the LOC type inner leads and the standard type inner leads are arranged on a same plane.

Furthermore, the present invention provides a semiconductor package in which a clearance between the LOC type inner leads and the die pad is set to be larger than a sum of thickness of the semiconductor chip and the die bond material.

And more, the present invention provides a semiconductor package in which the LOC type inner leads and the standard type inner leads are mixedly arranged along at least a side of the semiconductor chip.

Alternatively, the present invention provides a semiconductor package in which the LOC type inner leads are arranged along a side of the semiconductor chip and the standard type inner leads are arranged along another side of the semiconductor chip.

In a semiconductor package according to the present invention, a distance between upper surfaces of the outer leads and the upper surface of the sealing resin is different from a distance between lower surfaces of the outer leads and the lower surface of the sealing resin, and ends of the die pad are exposed in opposed side surfaces of the sealing resin and being on a plane parallel with a plane on which the leads are protruded.

Fuethermore, the present invention provides a semiconductor package in which at least a semiconductor chip, metal wires, LOC type inner leads having their tips extended above the semiconductor chip and standard type inner leads having their tips arranged outside of periphery of the semiconductor chip are sealed with a sealing resin, wherein the semiconductor chip has distributed electrode pads distributed and arranged on its upper surface and has at least either central electrode pads rectilinearly provided in a central region of the semiconductor chip or peripheral electrode pads provided along the periphery of the semiconductor chip, and the LOC type inner leads and the standard type inner leads are arranged on a same plane and mixedly arranged along a side of the semiconductor chip.

A semiconductor package of the present invention is manufactured with the steps of forming a die pad frame in which die pads are surrounded with a frame, depressing the die pad to make a displacement between the die pad and the frame, bonding a semiconductor chip to the die pad with a die bond material, superposing a lead frame, in which inner leads are surrounded with a frame, on the die pad frame so as to interpose the semiconductor chip between the die pads and the inner leads, welding the frame of the die pad and the frame of the lead frame together, sealing the die pad, the semiconductor chip and the inner leads with a sealing resin, and removing the frame of the die pad and the frame of the lead frame away.

Additional objects, advantages, and novel features of the invention shall be set forth in part in the description that follows and in part will be apparent to those skilled in the art upon examination of the following or may be learned by the practice of the invention. The objects and the advantages of the invention may be realized and attained by means of the instrumentalities and in combinations particularly pointed out in the appended claims.

BRIEF DESCRIPTION OF THE DRAWINGS

FIG. 4 is a sectional view taken along a line IV—IV in FIG. 1;

FIG. 5 is a sectional view taken along a line V—V in FIG. 1;

DETAILED DESCRIPTION

EMBODIMENT 1

Figure 1:
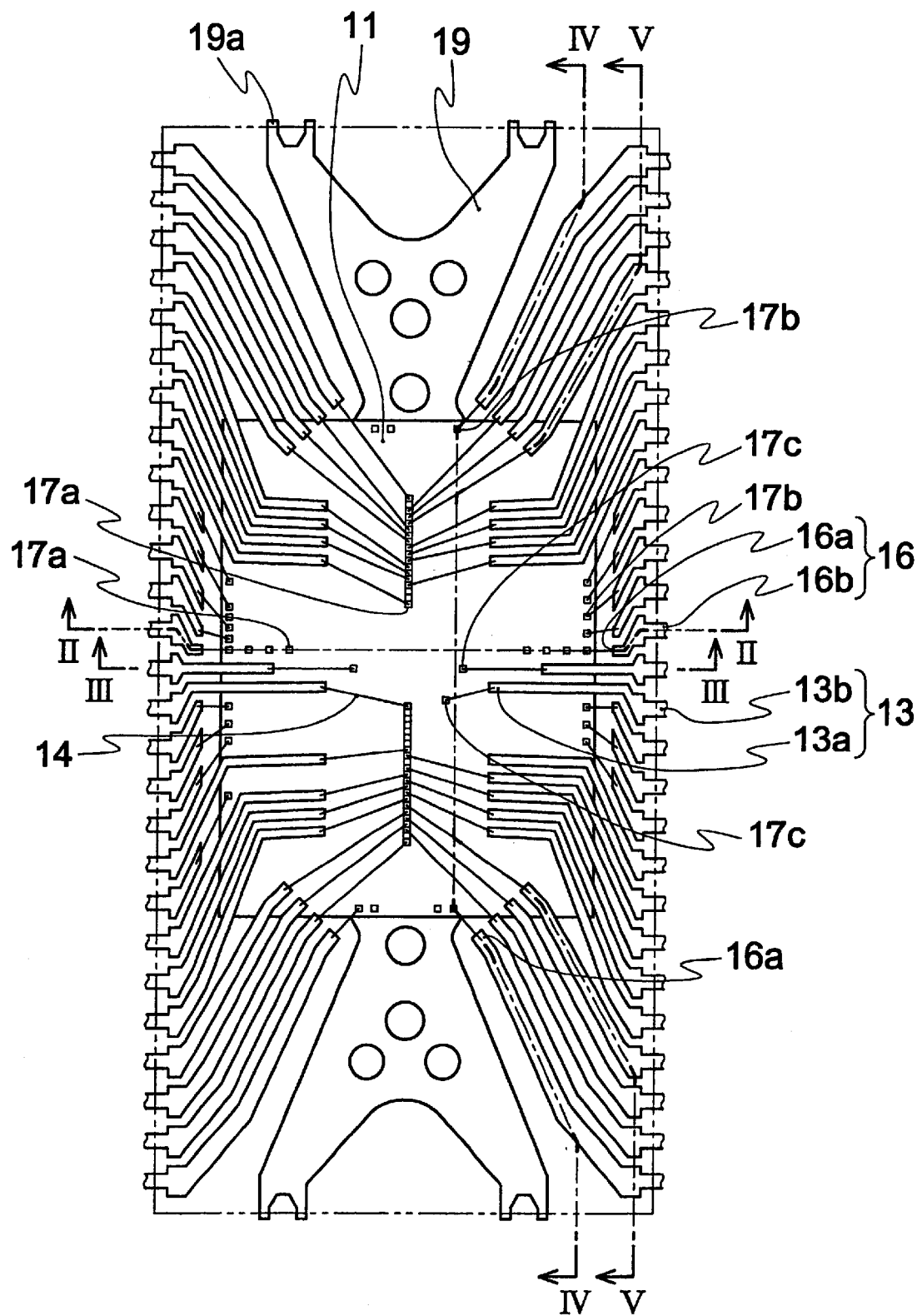
FIG. 1 is a plan view showing a semiconductor package according to Embodiment 1 of the present invention.
Figure 2:
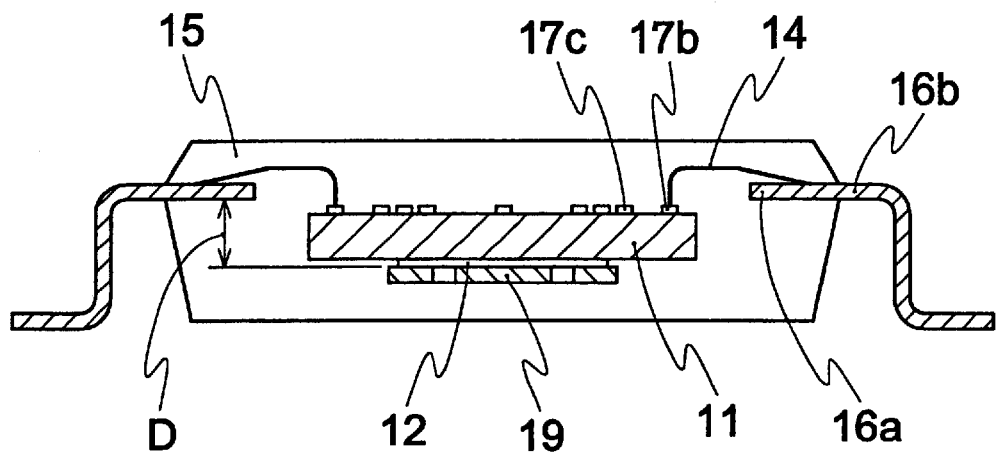
FIG. 2 is a sectional view taken along a line II—II in FIG. 1.

FIG. 1 is a plan view showing a semiconductor package according to Embodiment 1 of the present invention. In FIG. 1, a sealing resin is illustrated in a two-dotted chain line. FIG. 2 is a sectional view taken along a line II—II in FIG.

Figure 3:
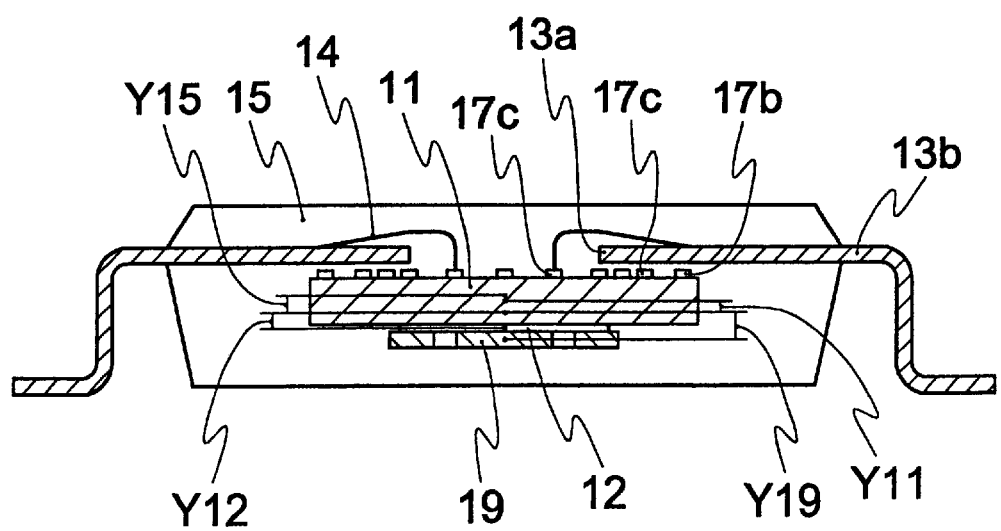
FIG. 3 is a sectional view taken along a line III—III in FIG. 1.
Figure 6:
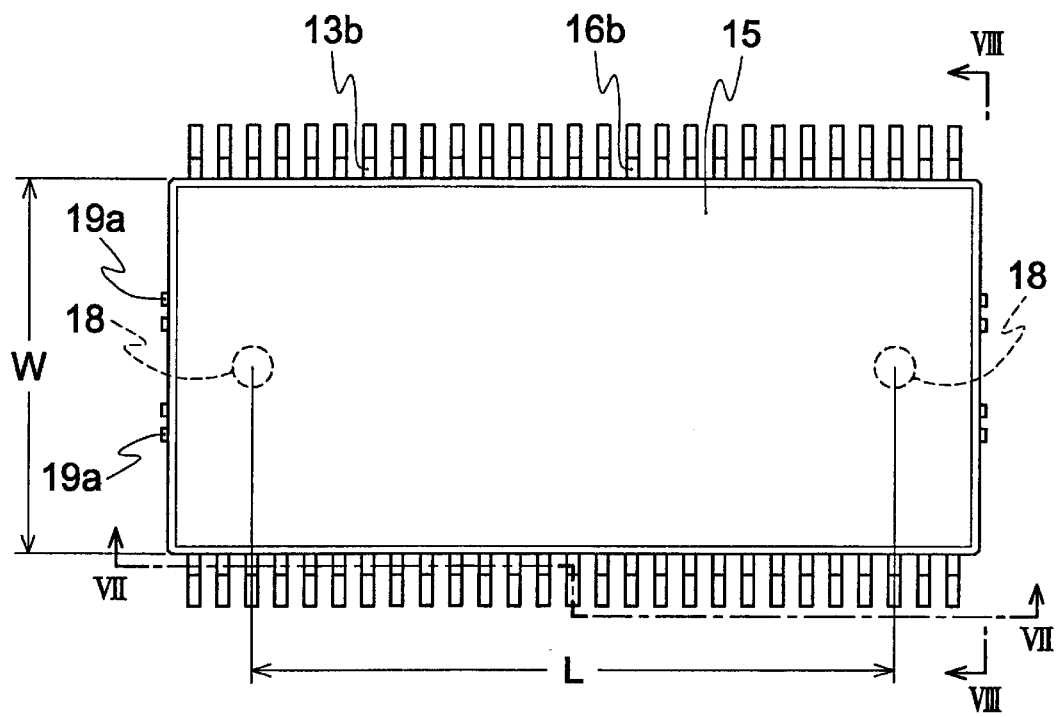
FIG. 6 is a top view showing the semiconductor package according to Embodiment 1 of the present invention.
Figure 7:
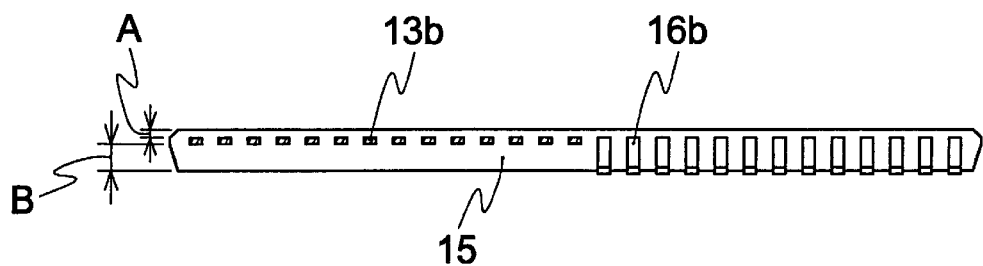
FIG. 7 is a half sectional side view seen in a direction of a line VII—VII in FIG. 6.
Figure 8:
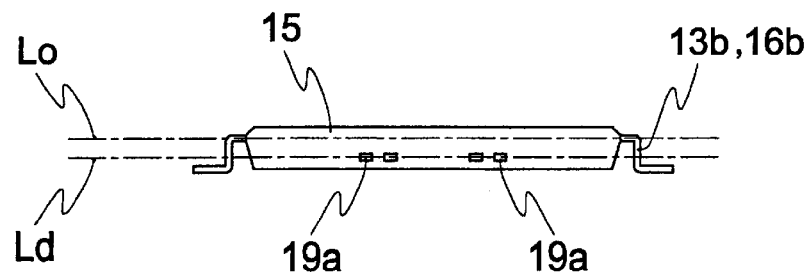
FIG. 8 is a side view seen in a direction of a line VIII—VIII in FIG. 6.
Figure 9:
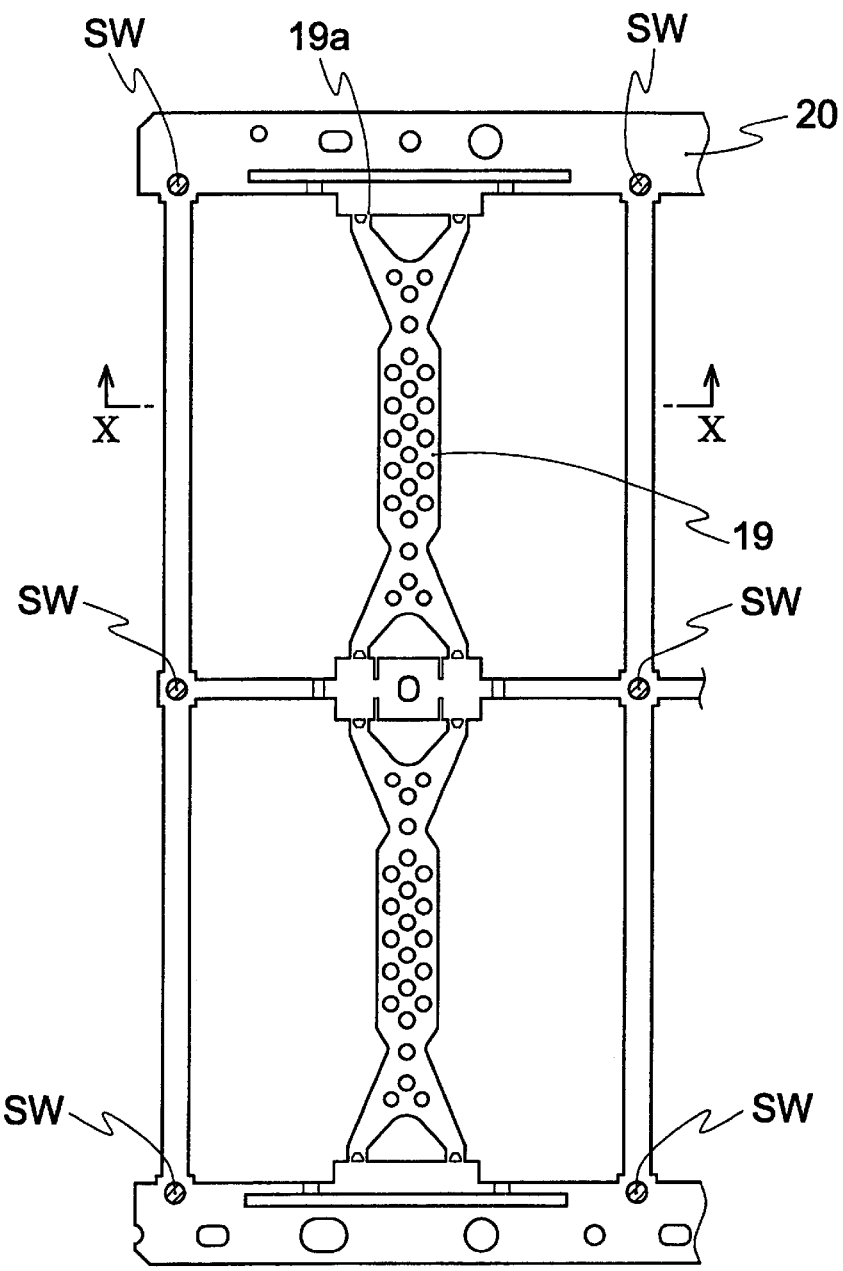
FIG. 9 is a plan view showing a part of a die pad frame according to the present invention.
Figure 10:
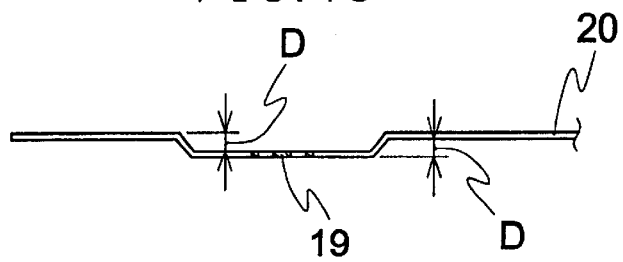
FIG. 10 is a sectional view taken along a line X—X in FIG. 9.

1 and FIG. 3 is a sectional view taken along a line III—III in FIG. 1. FIG. 4 is a sectional view taken along a line IV—IV in FIG. 1 and FIG. 5 is a sectional view taken along a line V—V in FIG. 1. FIG. 6 is a top view showing the semiconductor package according to Embodiment 1. FIG. 7 is a side view seen in a direction of a line VII—VII in FIG. 6. FIG. 8 is a side view seen in a direction of a line VIII—VIII in FIG. 6. FIG. 9 is a plan view showing a die pad frame with die pads to be used for the semiconductor package according to Embodiment 1. FIG. 10 is a sectional view taken along a line X—X in FIG. 9.

As shown in FIG. 2, a semiconductor chip 11 is bonded to a die pad 19 with a die bonding material 12 such as an adhesive or a pressure sensitive adhesive double coated tape. An electrode pad 17b provided on an upper surface of the semiconductor chip 11 and a tip portion of an inner lead 16a (a standard type inner lead) provided on the outside of the semiconductor chip 11 are electrically connected to each other through metal wire 14 such as a gold wire, an aluminum wire or a copper wire. The semiconductor chip 11, the die bonding material 12, the die pad 19 and the metal wires 14 are sealed with a sealing resin 15. Outer leads 13b and 16b formed successively to the inner leads 13a and 16a are protruded from a side surface of the sealing resin 15 and are formed to have a gull wing shape.

Next, a method of manufacturing the semiconductor package according to Embodiment 1 will be described below in detail. First of all, a die pad frame 20 provided with the die pads 19 is prepared, as shown in FIG. 9. Clearly shown in FIG. 10, the die pad 19 is immersed in a lower part than a frame portion of the die pad frame 20 by D. The dimension D (which will be hereinafter referred to as a die pad immersion D) is greater than the sum of a thickness of the semiconductor chip 11 and that of the die bonding material 12 shown in FIG. 2.

Next, the semiconductor chip 11 having electrode pads distributed and arranged over the whole surface shown in FIG. 1, is bonded to the die pad 19 through the die bonding material 12 shown in FIG. 2. As shown in FIG. 1, the semiconductor chip 11 to be used in Embodiment 1 comprises electrode pads 17a (hereinafter central electrode pads) provided rectilinearly in a central region of the semiconductor chip 11, electrode pads 17b (hereinafter peripheral electrode pads) provided along the outer periphery of the semiconductor chip 11, and the other electrode pads 17c (hereinafter distributed electrode pads) distributed and arranged over an upper surface of the semiconductor chip 11. An upper surface of the semiconductor chip 11 excluding the electrode pads 17 is protected with polyimide coating having a thickness of 8.5 μm, for example. In FIGS. 2 to 5, the polyimide coating protective film is not shown in order to emphasize the electrode pads 17.

Figure 11:
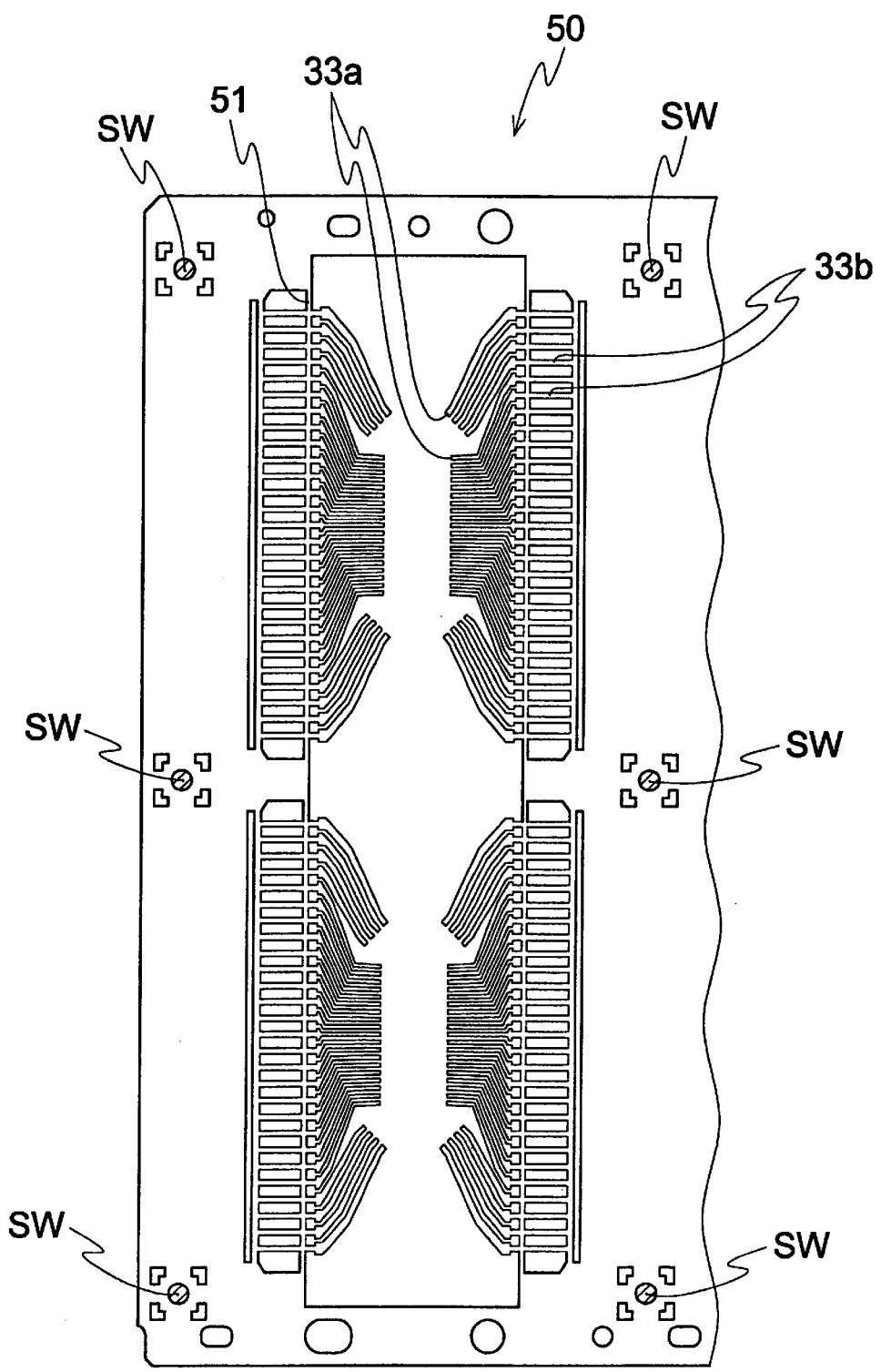
FIG. 11 is a plan view showing a part of a lead frame according to the present invention.

Next, a lead frame 50 as shown in FIG. 11 is prepared. The lead frame 50 comprises a frame (a side rail), a tie bar, a section bar, positioning holes, delivery holes, direction determining holes, inner leads and outer leads. The inner leads 33a and the outer leads 33b are formed successively on the same plane, and boundary portions between the inner leads 33a and the outer leads 33b are connected through the tie bar 51, and furthermore, ends of the outer leads 33b are connected to the frame. The inner leads 33a and the outer leads, 33b in FIG. 11 correspond to the inner leads 13a, 16a and the outer leads 13b, 16b in FIG. 1 respectively. The tips of some inner leads 33a are cut to form the inner leads 16a of FIG. 1 if necessary.

The present invention is characterized by the structure of the inner leads 13a and 16a, and an embodiment of the present invention is shown in FIG. 1. (Description of the lead frame will be omitted except for the structure of the inner leads.) As shown in FIG. 1, the lead frame according to the present embodiment has such a structure that the inner leads 13a (the LOC type inner leads) extended to cover the upper surface of the semiconductor chip 11 and the inner leads 16a (the standard type inner leads) provided on the outside of the periphery of the semiconductor chip 1 are mixed and arranged along at least one side of the semiconductor chip 11. The lead frame 50 is aligned and superposed on the die pad frame 20, which are welded at the welding points SW and fixed integrally.

Then, the electrode pads 17 and the inner leads 13a, 16a are electrically connected to each other through the metal wires 14 by using a wire bonding method. Since the wire bonding method, in which thermal energy, pressing force (mechanical energy) and ultrasonic vibration energy are applied, has been generally known, description thereof will be omitted. As shown in FIG. 1, the peripheral electrode pads 17b are connected to the standard type inner leads 16a through the metal wires 14.

The electrode pads 17a provided rectilinearly in the central region of the semiconductor chip 11 and the electrode pads 17c distributed and arranged on the upper surface of the semiconductor chip 11 are connected through the metal wires 14 to the inner leads (the LOC type inner leads) 13a extended to cover the upper surface of the semiconductor chip 11. At this time, the tips of the LOC type inner leads 13a are pressed with a jig (not shown) against the polyimide coating protective film on the semiconductor chip 11. Once the connection between the electrode pads 17 and the inner leads 13a through the metal wires 14 was made, the jig is removed to allow the inner leads 13a springing back so that a clearance G between the undersurfaces of the tips and the polyimide coating protective film provided on the semiconductor chip as shown in FIG. 5 is maintained.

Then, the die pad frame 20 and outer leads 33b fixed integrally are interposed and secured between an upper and lower mold, a fused sealing resin is injected into a cavity formed between the molds at a high temperature and a high pressure, thereby sealing the semiconductor chip 11, the die bonding material 12, the die pad 19, the inner leads 13a, 16a and the metal wires 14. When the sealing resin is solidified in the molds, eject pin receivers 18 shown in a dotted line of FIG. 6 are pushed up by eject pins (not shown) provided in any of the molds so that the semiconductor package is removed from the molds.

Thereafter, die pad ends 19a of the die pad frame 20 and the tie bar 51 of the lead frame 50 are cut and the frame of the lead frame are cut away from ends of the outer leads 33b. Subsequently, the outer leads 13b, 16b are set to have a gull wing shape as shown in FIG. 2. Thus, the semiconductor package shown in FIGS. 6 to 8 is finished. The cut surfaces of the die pad ends 19a of the die pad 19 are exposed to side surfaces of the sealing resin as shown in FIG. 8. Moreover, the cut parts of the tie bar are exposed on the side surfaces of the outer leads 13b, 16b in their gull wing-shaped bent portion (not shown), and the cut parts of the frame of the lead frame are exposed to the ends of the outer leads 13b and 16b which have the gull wing shape.

As described above, a semiconductor package, in which a distance A from an upper surface of the outer lead to an upper surface of the sealing resin is different from a distance B from a lower surface of the outer lead to a lower surface of the sealing resin and the ends 19a of the die pad 19 are exposed to the opposed side surfaces of the sealing resin 15 and on a line Ld which is in parallel with a line Lo on which outer leads 13b and 16b are drawn out from the sealing resin, is obtained.

In the semiconductor package thus constituted, a parallel space D is accurately maintained between the inner lead 13a and the die pad 19. Accordingly, when the semiconductor chip 11 is fixed to the die pad 19 through the die bonding material 12 and the lead frame is superposed on the die pad frame 20, an accurate clearance G can be maintained between the lower surface of the LOC type inner leads 13a extended to the upper surface of the semiconductor chip and the upper surface of the semiconductor chip opposed thereto as shown in FIG. 5. Consequently, it is possible to manufacture a semiconductor device easily and inexpensively irrespective of the arrangement in which the electrode pads are distributed over the whole upper surface of the semiconductor chip having a high function.

Figure 16:
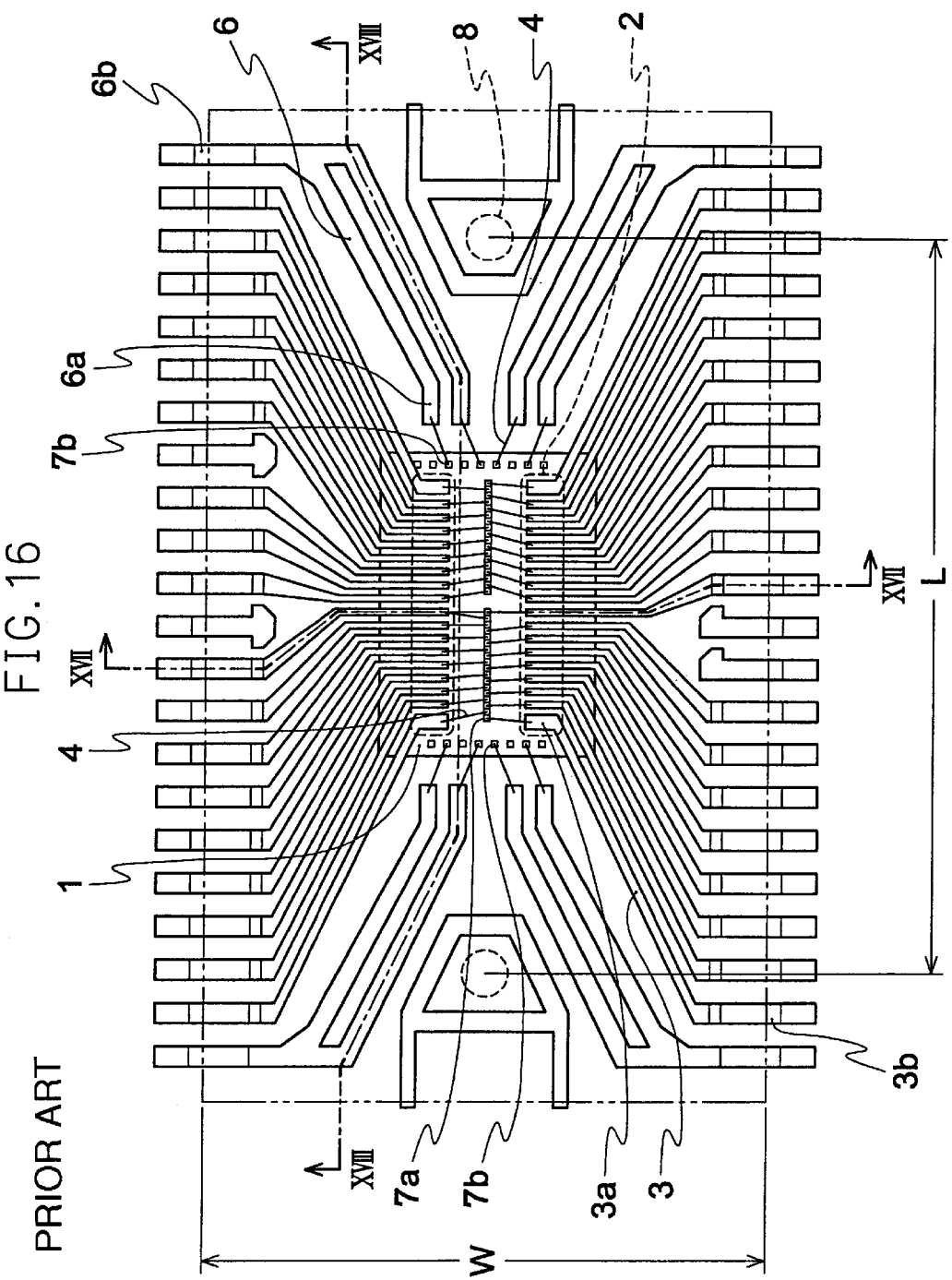
FIG. 16 is a plan view showing a conventional semiconductor package.

Moreover, in the case in which the eject pin receivers 18 shown in FIG. 6 are pushed up by eject pins after sealing to remove the sealed package from the mold, a moment can be calculated as a beam model in which a uniformly distributed load of W×P kgf/mm is applied between fulcrums, wherein a distance between two eject pin receivers 18 is represented by L mm, force required for the separation of the sealing resin and the surface of the mold per unit area is represented by P kgf/mm$^2$, and an external width of the sealing resin of the semiconductor package is represented by Wmm. At this time, a maximum bending moment generated in the central part of the semiconductor package is Mmax=W×P×L$^2$/8 kgf·mm. According to Embodiment 1, the semiconductor chip 11 is interposed between the LOC type inner leads 13a and the die pad 19, thus a stress generated on the semiconductor chip can be considerably reduced as compared with a conventional semiconductor chip sealed with only the sealing resin as shown in FIG. 16.

When the moment is applied, a strain ε generated on each of the sealing resin 15, the semiconductor chip 11, the die bonding material 12 and the die pad 19 is changed linearly from a tension to a compression in such a manner that a maximum tensile strain generated on the upper surface of the sealing resin 15 is sequentially decreased so that the strain is set to zero on a neutral axis over the section of the semiconductor package and a compressive strain is sequentially increased on a lower side so that a maximum compressive strain is generated on the lower surface of the sealing resin 15 on the lower side.

A stress applied to each components on the central section of the semiconductor package is represented as a product of the strain E and a modulus of direct elasticity E of the component. In FIG. 3, the semiconductor chip 11 has a sectional area of S11, a thickness of T11 and a modulus of direct elasticity E11. The die bonding material 12 has a sectional area of S12, a thickness of T12 and a modulus of direct elasticity E12. The sealing resin 15 has a sectional area of S15, a thickness of T15 and a modulus of direct elasticity E15. The die pad 19 has a sectional area of S19, a thickness of T19 and a modulus of direct elasticity E19. Moreover, if a distance from the neutral axis to a center of gravity of each component is set to Y11, Y12, Y15 and Y19 as shown in FIG. 3, a geometrical moment of inertia I of the semiconductor package is calculated with the following equation 1 as a converted value corresponding to the modulus of elasticity E11 of the semiconductor chip 11.

$$I=(S11\times Y11^2+S11\times T11^2/12)+(E12/E11)$$
$$\times(S12\times Y12^2+S12\times T12^2/12)$$
$$+(E15/E11)\times(S15\times Y15^2+S15\times$$
$$T15^2/12)+(E19/E11)\times$$
$$(S19\times Y19^2+S19\times T19^2/12) \qquad \text{Equation 1}$$

In the equation 1, if calculation is carried out with Y11=Y19=0, Y15=0.24 mm, T11:T19:T15=0.3:0.125:1.0, S11:S19: S15=3:1:6, E11=17000 kgf/mm$^2$, E19=12000 kgf/mm$^2$, E15=2000 kgf/mm$^2$ at an ordinary temperature and E15=500 kgf/mm$^2$ at a high temperature, the ratio of the geometrical moment of inertia occupied by the semiconductor chip 11, the die pad 19 and the sealing resin 15 is obtained as semiconductor chip:die pad:sealing resin= 1:1.85:2.61 at an ordinary temperature and semiconductor chip: die pad:sealing resin=1:1.85:0.65 at a high temperature.

Figure 17:
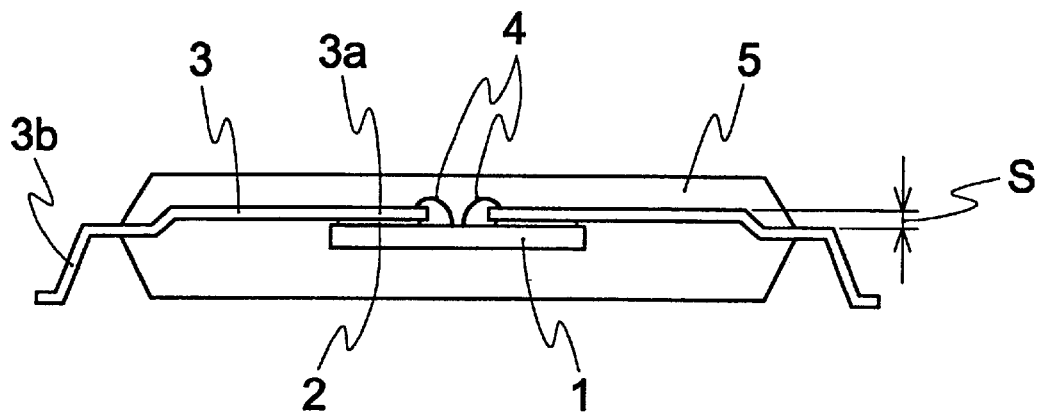
FIG. 17 is a sectional view taken along a line XVII—XVII in FIG. 16.
Figure 18:
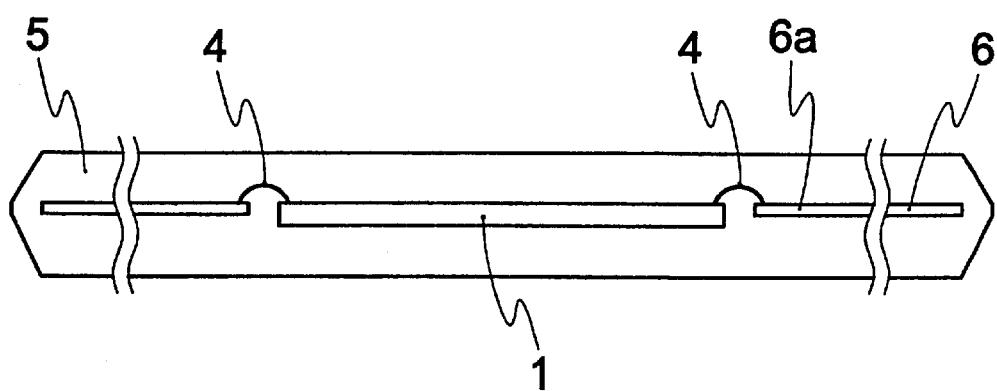
FIG. 18 is a sectional view taken along a line XVIII—XVIII in FIG. 16.
Figure 1:
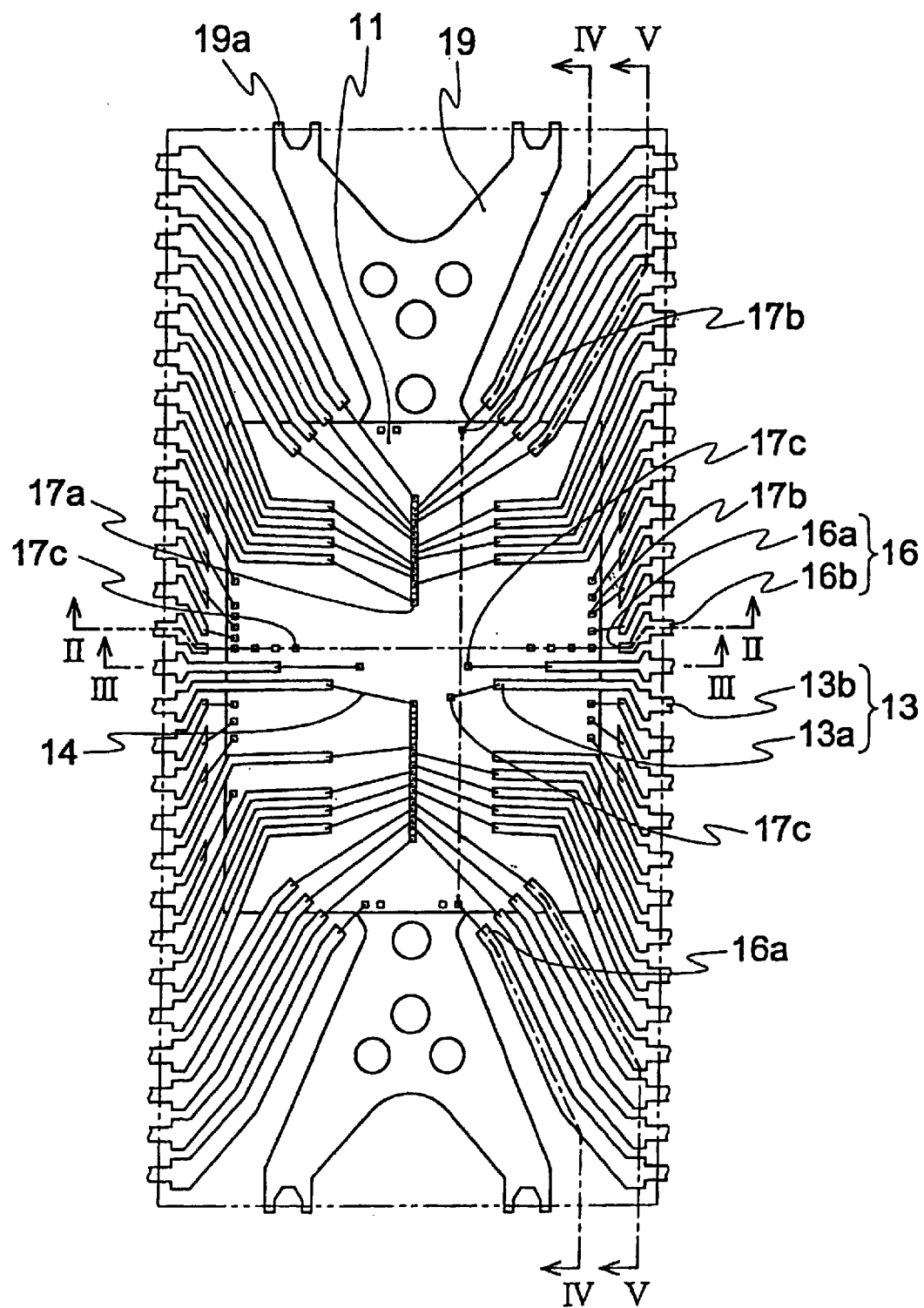

A geometrical moment of inertia I2 in the central part of the conventional semiconductor device shown in FIG. 17 is also calculated by the following equation 2 as a converted value corresponding to the modulus of elasticity of the semiconductor chip 1 in the same manner as in the equation 1. S1, T1 and E1 represent a sectional area, a thickness and a modulus of direct elasticity of the semiconductor chip 1 respectively. S5, T5 and E5 represent a sectional area, a thickness and a modulus of direct elasticity of the sealing resin 5. Moreover, Y1 and Y5 represent a distance from the neutral axis to a center of gravity of the chip 1 and sealing resin 5 respectively. In the equation 2 which corresponds to the section shown in FIG. 17, the die pad and the die bonding material indicated in the equation 1, that is, in FIG. 3 are assumed to be replaced with the sealing resin and the equation 2 has the same number of terms as those of the equation 1.

$$I2=(S1\times Y1^2+S1\times T1^2/12)+(E5/E1)\times$$
$$(S12\times Y12^2+S12\times T12^2/12)+(E5/E1)\times$$
$$(S5\times Y5^2+S5\times T5^2/12)+(E5/E1)\times$$
$$(S19\times Y19^2+S19\times T19^2/12) \qquad \text{Equation 2}$$

If the ratio of the semiconductor chip 1 to the sealing resin 5 in the geometrical moment of inertia I2 of the equation 2 is calculated in the same manner as in the equation 1, semiconductor chip:sealing resin=1:2.9 at an ordinary temperature and semiconductor chip:sealing resin=1:0.73 at a high temperature are obtained.

(E19/E11)×(S19×Y19$^2$+S19×T19$^2$/12) in the equation 1 can be increased to six times as much as (E5/E1)×(S19× Y19$^2$+S19 ×T19$^2$/12) in the equation 2 because the sealing resin has a modulus of direct elasticity of E5=2000 kgf/mm$^2$, while the die pad of a copper has a modulus of direct elasticity of E19=12000 kgf/mm$^2$. Moreover, if the die pad is formed of a 42 alloy (Fe-Ni alloy), it is possible to obtain E19=14800 kgf/mm$^2$ which increases the (E19/E11)×(S19× Y19$^2$+S19×T19$^2$/12) in the equation 1 7.4-fold. Furthermore, moduli of direct elasticity E5 and E15 of the sealing resin to be an organic material have much smaller values at a high temperature than those at an ordinary temperature. For example, if a temperature at which the semiconductor package sealed with the resin is to be separated from the mold by the eject pins is 170° C., the modulus of direct elasticity is set to be small, that is, E5=E15=500 kgf/mm$^2$ and is thus reduced to a quarter as compared with that at the ordinary temperature.

As is calculated above, accordingly, when the conventional semiconductor package is removed from the mold at a high temperature, a sharing ratio of a bending moment between the semiconductor chip and the sealing resin is set to 1:0.73. A load applied to the semiconductor chip is more increased than a load applied to the sealing resin so that a bad influence might be caused. When a damage is caused on the semiconductor chip covered with the sealing resin, it is necessary to carry out an inspection by using a detecting method having a low efficiency such as an X-ray inspection or an ultrasonic inspection. In the semiconductor package according to the present invention, therefore, there is provided a metal die pad having a rigidity which is not reduced at such a high temperature that the rigidity of the sealing resin cannot be expected, load sharing is set to semiconductor chip:die pad:sealing resin=1:1.85:0.65, for example, and the die pad accepts the greatest load so that the load to be applied to the semiconductor chip can be reduced.

EMBODIMENT 2

In Embodiment 1, the description has been given to the semiconductor package in which the LOC type inner leads and the standard type inner leads are mixed and arranged over the four sides of the semiconductor chip 11. In Embodiment 2, description will be given, with referenced to FIG. 12, to a semiconductor package constituted by the die pad frame 20 of Embodiment 1, the lead frame of Embodiment 1 and a semiconductor chip 21, so called "a shrink chip", having almost the same arrangement of electrode pads as that of the chip used in Embodiment 1 and having a reduced dimension.

Figure 12:
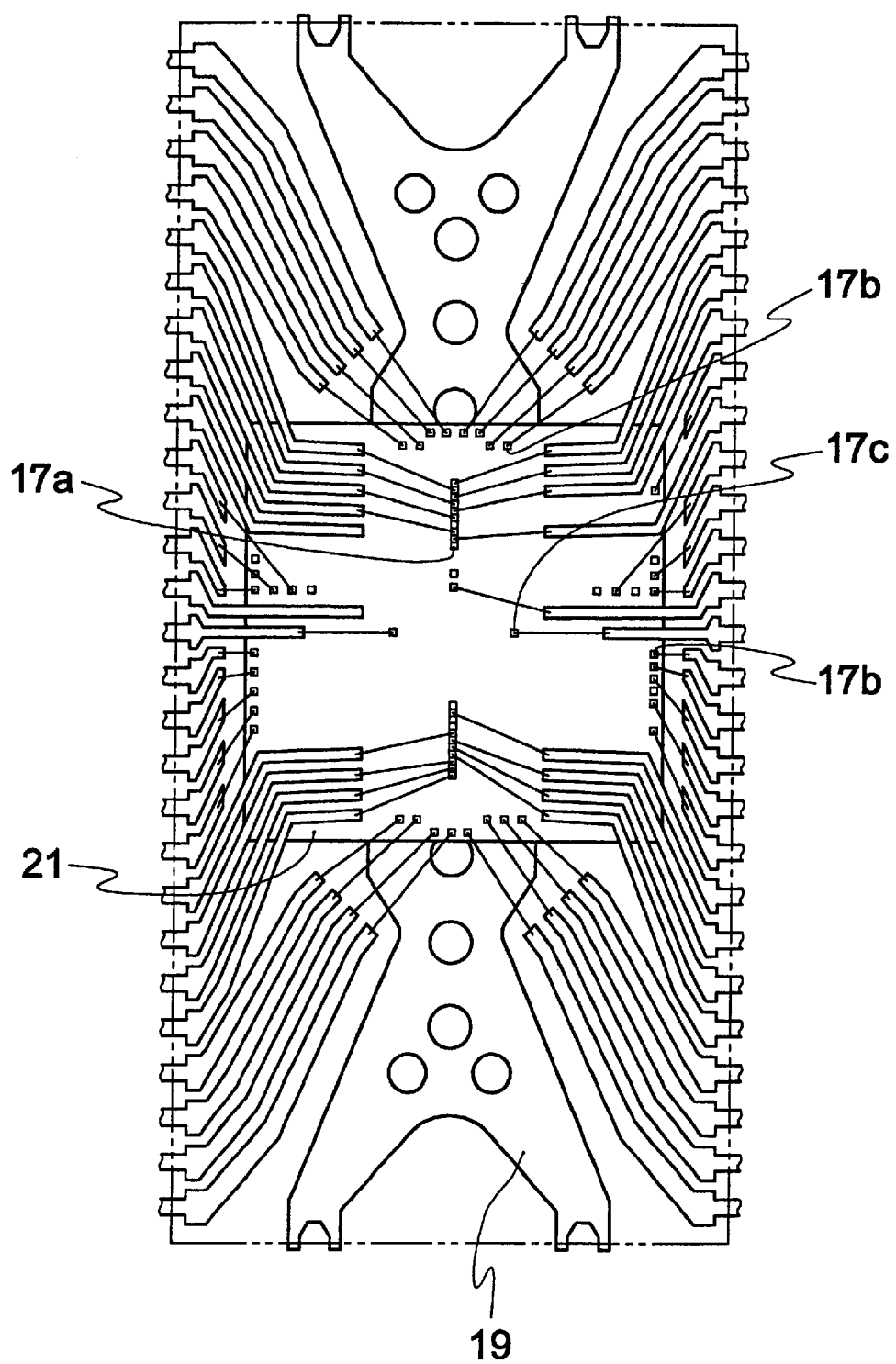
FIG. 12 is a plan view showing the semiconductor package according to Embodiment 2 of the present invention.

Peripheral electrode pads 17b are provided on the semiconductor chip 21, and connected to standard type inner leads through metal wires. Central electrode pads 17a and distributed electrode pads 17c are connected to LOC type inner leads through the metal wires. As shown in FIG. 12, in the present embodiment, corresponding to the arrangement of the electrode pads, the LOC type inner leads and the standard type inner leads are mixed and arranged on two opposed sides of the semiconductor chip and only the standard type leads are provided on two other sides. Thus, if the semiconductor package has such a structure that the LOC type inner leads and the standard type inner leads are mixed and arranged on at least one of the sides of the semiconductor chip, the same advantages as those of Embodiment 1 can be obtained.

EMBODIMENT 3

In Embodiment 1 and Embodiment 2, there has been described the example in which the semiconductor package is constituted by using the semiconductor chip provided with the peripheral electrode pads arranged along the outer peripheries of four sides, the central electrode pads arranged on the center and the distributed electrode pads which is distributed and arranged over the upper surface of the semiconductor chip. However, if a die pad immersion D is set to be larger than the sum of a thickness of the semiconductor chip and a thickness of the die bonding material so as to maintain a predetermined clearance G between the LOC type inner leads and the upper surface of the semiconductor chip, it is possible to provide an inexpensive semiconductor package having high quality irrespective of the arrangement of the electrode pads on the semiconductor chip.

Figure 13:
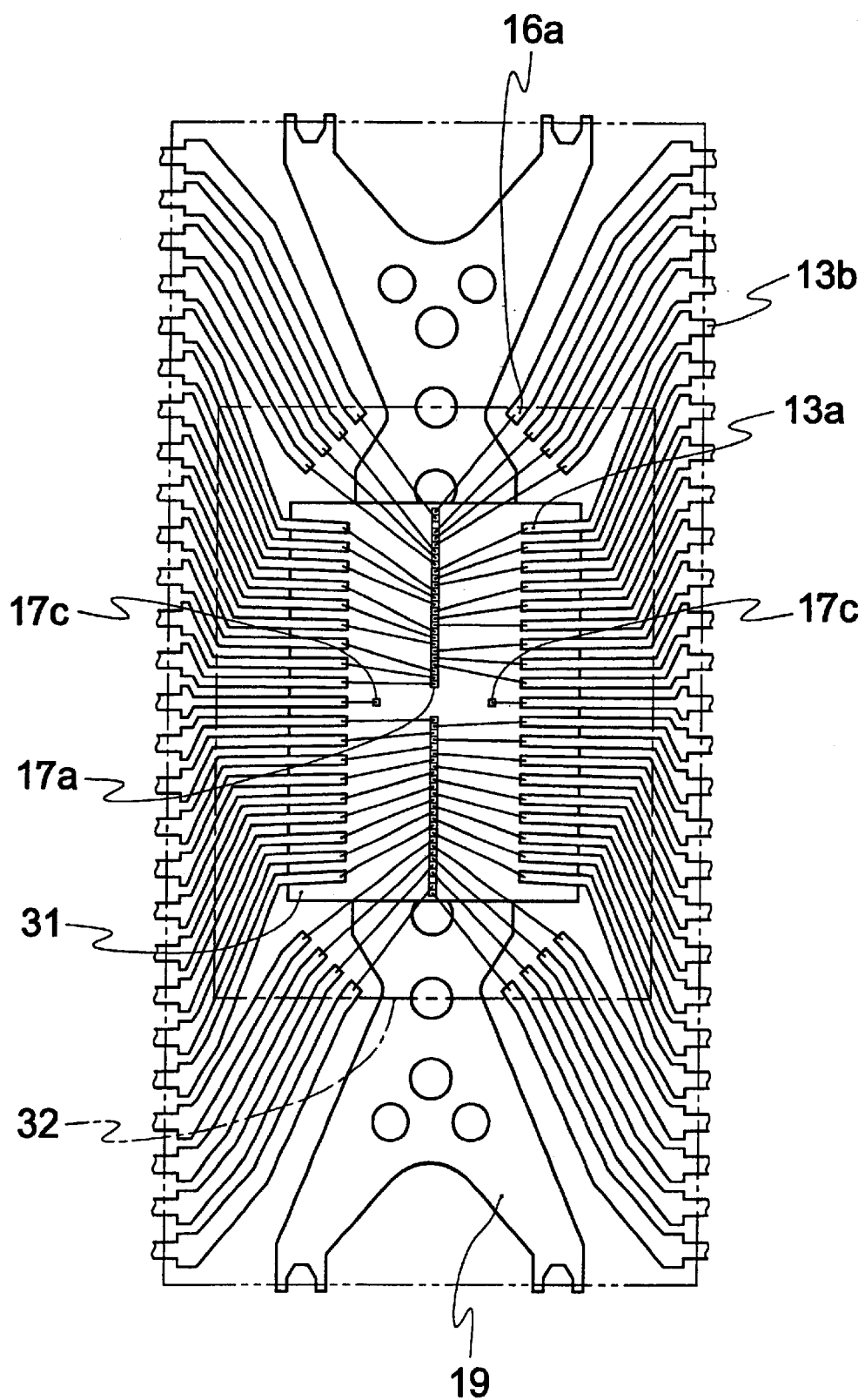
FIG. 13 is a plan view showing a semiconductor package according to Embodiment 3 of the present invention.
Figure 14:
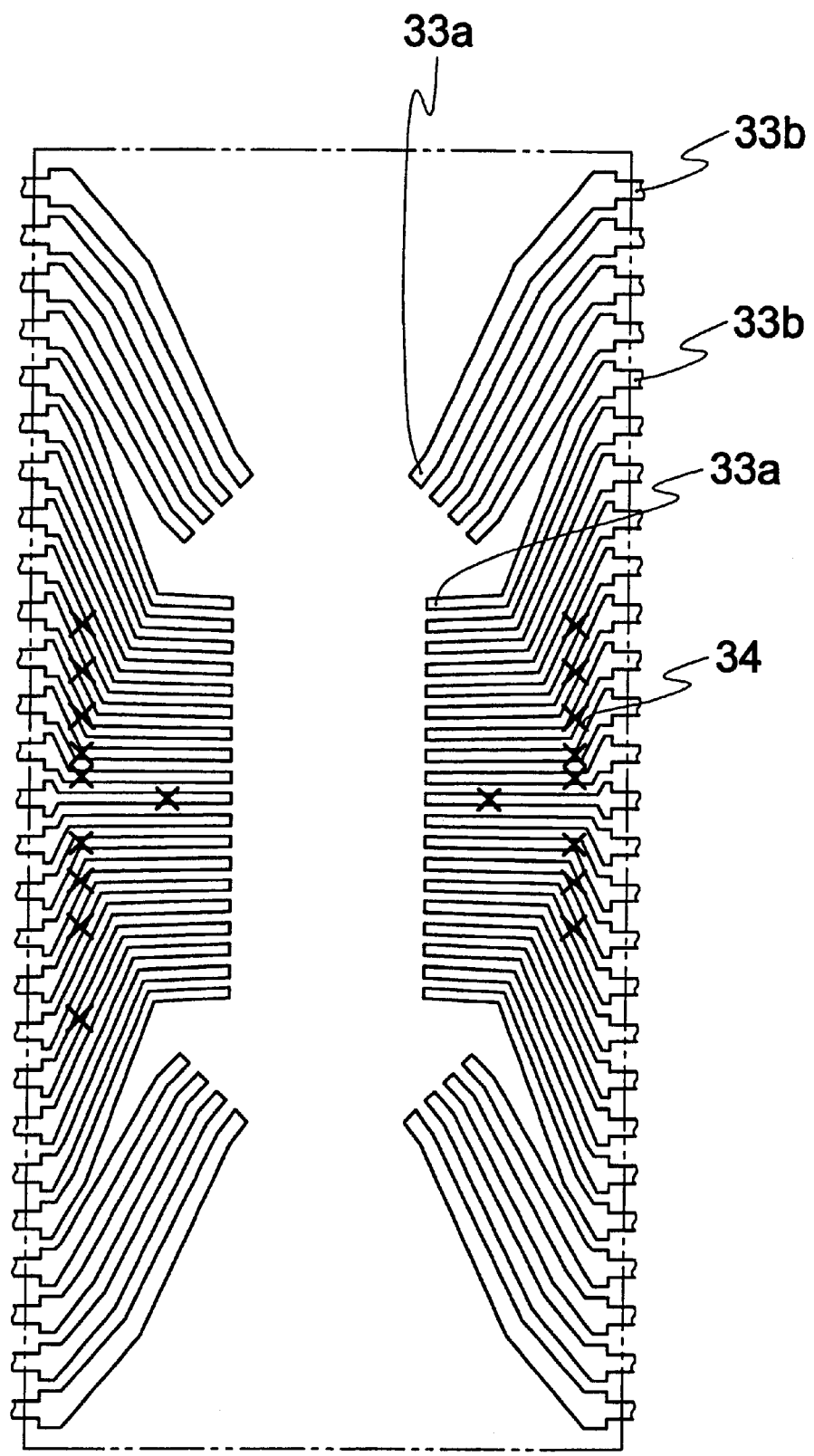
FIG. 14 is an enlarged detail of inner leads of a lead frame to be used for the semiconductor package according to the present invention.

FIG. 14 is a plan view showing inner leads to be used for a semiconductor package according to the present invention. FIG. 13 is a plan view showing a state in which a semiconductor chip is fixed to a die pad of a die pad frame same as one of Embodiment 1 with an die bonding material and electrode pads and inner leads are electrically connected by a wire bonding method.

In FIG. 13, central electrode pads 17a and distributed electrode pads 17c are arranged on the upper surface of a semiconductor chip 31. If inner leads shown in FIG. 14 are applied to the semiconductor chip 31, it is possible to obtain such a structure that LOC type inner leads 13a is opposed to two sides of the semiconductor chip 31 and standard type inner leads 16a are opposed to two opposed sides as shown in FIG. 13.

In the case in which the semiconductor chip 31 having a small dimension in a direction of arrangement of the central electrode pads 17a is applied to the die pad frame 16 and the lead frame, the above-mentioned structure is obtained. The size of the semiconductor chip, for example, the memory chip can be reduced from year to year. As a generation advances sequentially from a first generation, a semiconductor chip is shrunk so that the size is reduced. According to the present invention, also with a large-sized semiconductor chip 32 of the previous generation shown in a one-dotted chain line or a new small-sized semiconductor chip 31 shown in a solid line, it is possible to inexpensively obtain a semiconductor package having the same effects by using just the same manufacturing process and manufacturing device by using the same die pad frame and lead frame without a change if the arrangement of the electrode pads of the semiconductor chip is analogous.

In the conventional semiconductor package, a great variety of lead frames which are different in their arrangement of inner leads must be prepared corresponding to various semiconductor chips having differences in their size or arrangements of electrode pads. According to the present invention, as described above, the inner lead 33a (i.e. the lead frame) and the die pad 19 (i.e. the die pad frame) can be standardized and even unified into one type respectively. Thus, the die pad frame and the lead frame can be manufactured inexpensively by a punching or blanking.

EMBODIMENT 4

As shown in FIGS. 1, 12 and 13 respectively, the lead frames used in Embodiment 1 to 3 are different at least in shapes of their inner leads. Therefore, the lead frame of FIG. 14 is set to be a standard lead frame and some inner leads 33a are partly cut away at points indicated with X-mark 34 to be the inner leads of FIG. 1. It becomes possible to obtain various kinds of lead frames (e.g. the lead frame of FIG. 1, FIG. 12 and FIG. 13) easily from standardized lead frame shown in FIG. 14 to reduce manufacturing costs of semiconductor packages.

In the lead frame shown in FIG. 14, tips of the LOC type inner leads will be aligned rectilinearly parallel with a side of the semiconductor chip and tips of the standard type inner leads will also be aligned rectilinearly but inclined with a side of the chip. However, how the tips of the inner leads are aligned (e.g. the tips are aligned rectilinearly parallel with four sides of the chip), it is possible to obtain the same advantages of the semiconductor package according to the present invention.

EMBODIMENT 5

In Embodiment 1 to 4, semiconductor packages comprising a die pad frame, a lead frame having LOC type inner leads and standard type inner leads on a same plane and a semiconductor chip having electrode pads arranged and distributed on its upper surface are explained.

According to the present invention, a semiconductor chip is fixed to a die pad having a die pad immersion D with an adhesive. Therefore, neither the LOC type inner leads nor the standard type inner leads come in contact with the semiconductor chip. Moreover, the arrangement of the electrode pads on the semiconductor chip does not influence on the enhancement of the rigidity of the semiconductor package according to the present invention.

Accordingly, in the semiconductor package having constitution of Embodiment 1 to 4, the arrangement of electrode pads is not restricted and can be selected freely in its design process. For example, also with a semiconductor chip 41 in which central electrode pads 17a, peripheral electrode pads 17b and distributed electrode pads 17c are arranged in parallel with its long side, it is possible to form a semiconductor package having a high rigidity easily and inexpensively by means of inner leads shown in FIG. 15.

In the embodiments described above, four die pad ends 19a which connect the die pad 19 and the die pad frame 20 are provided in order to prevent the die pad 19 from being inclined with die pad frame 20, as shown in FIG. 9. However, two or more die pad ends may be provided. Moreover, the die pad ends 19a can also be provided in a direction perpendicular to the direction shown in FIG. 9. Furthermore, while the die pad is provided with a plurality of circular through holes, the number and shape of through holes can be varied if the rigidity of the semiconductor package can be maintained.

Moreover, there has been described the semiconductor package in which a semiconductor chip having electrode pads arranged and distributed on its surface, a lead frame having LOC type inner leads and standard type inner lead mixed and arranged along each side of the semiconductor chip, and metal wires connecting each electrodes pad to respective inner lead and a die pad are sealed with sealing resin.

Figure 15:
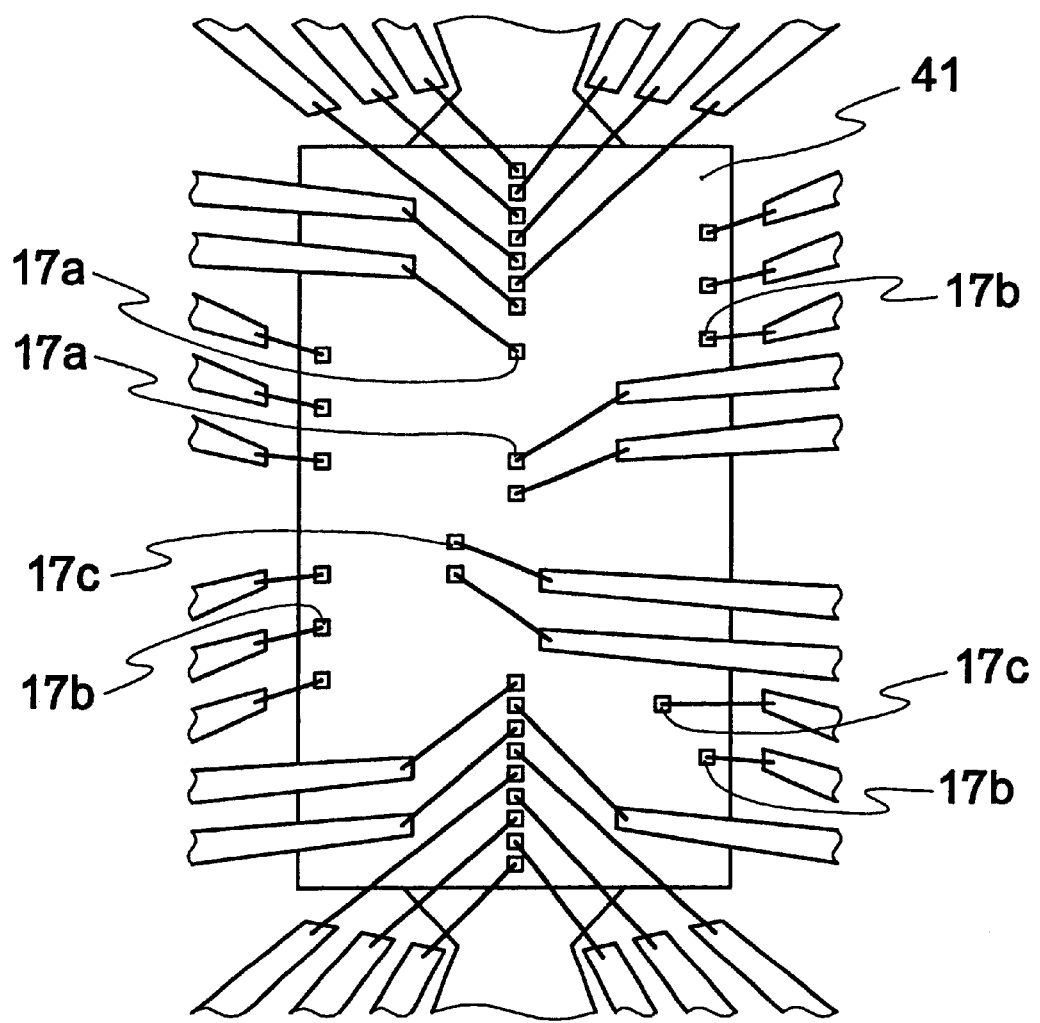
FIG. 15 is a plan view showing a semiconductor package according to Embodiment 5 of the present invention.

However, with the arrangement of the electrode pad shown in FIG. 15, the electrode pads are not provided in the vicinity of the LOC type leads. Therefore, if the LOC type leads is bonded to the upper surface of the semiconductor chip with a adhesive or a suitably divided adhesive tape to support the semiconductor chip, the die pad 19 shown in FIG. 3 can be omitted. In that case, it is necessary to fill a space between the upper surface of the semiconductor chip and the lower surface of the LOC type lead 13a with the adhesive.

Whether or not the structure having the die pad 19 omitted can be employed is determined by a ratio R of the part occupied by the semiconductor chip in the geometrical moment of inertia of the semiconductor package to that by the sealing resin. Since the geometrical moment of inertia in the section of the central part of the semiconductor package is represented by the equation 1 or 2, the ratio R is represented by the following equation 3.

$$R = \{S11 \times E11 \times (Y11^2 + T11^2/12)\} / \{S15 \times E15 \times (Y15^2 + T15^2/12)\}5$$  Equation 3

In the equation 3, if the material value (e.g. a modulus of direct elasticity) used in the equations 1 and 2 is utilized to calculate the ratio R at a high temperature, $R = (90 \times S11)/(41.6 \times S15)$ is obtained. If the ratio R is greater than 1, the semiconductor chip accepts more loads than the sealing resin. If the ratio R is smaller than 1, the sealing resin accepts more loads than the chip. Accordingly, if $S11/S15 \leq 0.46$ is satisfied, reinforcement is not required and the die pad can be omitted. The above-mentioned value is calculated on the assumption of the high temperature physical property of the sealing resin and others for the description and is not restricted thereto. In the semiconductor package using the semiconductor chip having the electrode pads distributed and arranged on its surface and the lead frame having the LOC type and standard type inner leads formed on a plane, the die pad can be omitted depending on a ratio of the sectional area of the semiconductor chip to that of the sealing resin in the central section of the semiconductor package so as to obtain more inexpensive semiconductor device.

Since the present invention has the above-mentioned structure, the following advantages can be obtained.

The LOC type inner leads and the standard type inner leads are provided on the same plane and the predetermined gap is provided together with the upper surface of the semiconductor chip. Therefore, the semiconductor chip having the electrode pads broadly distributed and arranged thereon can also be employed and electrical connections between the electrode pads and the inner leads through the metal wires can be carried out easily. Furthermore, since the semiconductor chip, the bonding material and the die pad are sealed with the sealing resin, the modulus of section of the semiconductor package can be enlarged with the die pad if necessary. Therefore, it is possible to reduce a stress generated on the semiconductor chip especially at a high temperature.

Moreover, the LOC type inner leads are provided on one side of the semiconductor chip and the standard type inner leads are provided on another orthogonal side of the semiconductor chip. The LOC type inner leads and the standard type inner leads are provided on the same plane separated from the upper surface of the semiconductor chip. Therefore, also in the semiconductor chip in which the central electrode pads and the peripheral electrode pads are provided, electrical connections between pads and leads can be carried out easily through metal wires. Moreover, since the semiconductor chip, the bonding material and the die pad are sealed with the sealing resin, the modulus of section of the semiconductor package can be supplemented with the die pad if necessary so that it is possible to reduce the stress generated on the semiconductor chip at a high temperature.

Furthermore, a plane on which the leads are drawn from the sealing resin and a plane on which the ends of the die pads are exposed from the sealing resin are placed apart by the die pad immersion D. And then, the semiconductor chip is interposed between the leads and the die pad and the portions to be pushed up with the eject pins are provided in the region where the die pad is arranged. Therefore, it is possible to reduce the stress generated on the semiconductor chip especially at a high temperature.

Moreover, it is possible to obtain an inexpensive semiconductor package comprising a semiconductor chip including at least one of central electrode pads and peripheral electrode pads in addition to distributed electrode pads and inner leads having LOC type inner leads and standard type inner leads mixed and arranged on the same plane along a side of the semiconductor chip, wherein the LOC type inner leads and a region where the electrode pad of the semiconductor chip is not provided are fixed to each other with an adhesive and are sealed with a sealing resin, resulting in an enhancement in a strength at a high temperature.

What is claimed is:

1. A semiconductor package comprising:
   a semiconductor chip,
   a die pad,
   a die bonding material fixing the semiconductor chip to the die pad,
   lead-on-chip (LOC) inner leads having tips spaced from and extending across the semiconductor chip,
   standard inner leads, respective metal wires connecting the tips of the LOC inner leads to electrode pads on the semiconductor chip and tips of the standard inner leads to electrode pads on the semiconductor chip, a sealing resin encapsulating the semiconductor chip, the die pad, the tips of the LOC and the standard inner leads, and the metal wires, and respective outer leads extending successively from the LOC inner leads and the standard inner leads and protruding outwardly from the sealing resin, wherein the LOC inner leads and the standard inner leads are co-planar.

2. The semiconductor package of claim 1, wherein a clearance between the LOC inner leads and the die pad is larger than total thickness of the semiconductor chip and the die bond material.

3. The semiconductor package of claim 1, wherein the LOC inner leads and the standard inner leads are both arranged along at least one side of the semiconductor chip.

4. The semiconductor package of claim 1, wherein the LOC inner leads are arranged along a first side of the semiconductor chip and the standard inner leads are arranged along a second side of the semiconductor chip.

5. A semiconductor package comprising:

a semiconductor chip, a die pad, a die bonding material fixing the semiconductor chip to the die pad, lead-on-chip (LOC) inner leads having tips spaced from and extending across the semiconductor chip, standard inner leads, respective metal wires connecting the tips of the LOC inner leads to electrode pads on the semiconductor chip and tips of the standard inner leads to electrode pads on the semiconductor chip, a sealing resin encapsulating the semiconductor chip, the tips of the LOC and the standard inner leads, and the metal wires, and respective outer leads extending successively from the LOC inner leads and the standard inner leads and protruding outwardly from the sealing resin, wherein a distance between upper surfaces of the outer leads and an upper surface of the sealing resin is different from a distance between lower surfaces of the outer leads and a lower surface of the sealing resin, and ends of the die pad are exposed at opposed side surfaces of the sealing resin and lie in a plane parallel to a plane in which the outer leads protrude.

6. A semiconductor package including at least a semiconductor chip, metal wires, lead-on-chip (LOC) inner leads having tips spaced from and extending over the semiconductor chip, and standard inner leads having tips arranged outside of a periphery of the semiconductor chip sealed with a sealing resin, wherein the semiconductor chip has distributed electrode pads distributed and arranged on an upper surface of the semiconductor chip and has at least either central electrode pads rectilinearly located in a central region of the semiconductor chip or peripheral electrode pads located along the periphery of the semiconductor chip, and the LOC inner leads and the standard inner leads are co-planar and both arranged along one side of the semiconductor chip.

* * * * *

(12) EX PARTE REEXAMINATION CERTIFICATE (5342nd)
United States Patent
Takata et al.

(10) Number: US 6,518,652 C1
(45) Certificate Issued: Apr. 11, 2006

(54) PACKAGED SEMICONDUCTOR DEVICE

(75) Inventors: Yasuki Takata, Tokyo (JP); Hiroshi Horibe, Tokyo (JP); Kazunari Michii, Tokyo (JP)

(73) Assignee: Mitsubishi Denki Kabushiki Kaisha, Tokyo (JP)

Reexamination Request:
No. 90/006,627, May 7, 2003

Reexamination Certificate for:
Patent No.: 6,518,652
Issued: Feb. 11, 2003
Appl. No.: 09/808,151
Filed: Mar. 15, 2001

(30) Foreign Application Priority Data

Sep. 4, 2000 (JP) .................................. 2000-266631

(51) Int. Cl.
*H01L 23/495* (2006.01)

(52) U.S. Cl. ........................................ 257/676; 257/666
(58) Field of Classification Search ................ None
See application file for complete search history.

(56) References Cited

U.S. PATENT DOCUMENTS

| | | | | |
|---|---|---|---|---|
| 4,984,059 A | * | 1/1991 | Kubota et al. | 257/676 |
| RE35,109 E | * | 12/1995 | Kubota et al. | 257/676 |
| 5,589,420 A | * | 12/1996 | Russell | 438/123 |
| 5,637,915 A | * | 6/1997 | Sato et al. | 257/666 |
| 5,659,199 A | * | 8/1997 | Mori et al. | 257/676 |
| 6,229,202 B1 | * | 5/2001 | Corisis | 257/666 |
| 6,229,205 B1 | * | 5/2001 | Jeong et al. | 257/676 |
| 6,396,134 B1 | * | 5/2002 | Kinsman | 257/676 |
| 6,486,539 B1 | * | 11/2002 | Tandy | 257/669 |
| 6,630,732 B1 | * | 10/2003 | Corisis | 257/691 |

FOREIGN PATENT DOCUMENTS

JP 6-188353 7/1994

OTHER PUBLICATIONS

English translation of JP 6-188,353.*

* cited by examiner

*Primary Examiner*—George Eckert

(57) ABSTRACT

A semiconductor package includes a semiconductor chip, a die pad, an adhesive, metal wires, LOC inner leads, and standard inner leads sealed within a sealing resin. The LOC inner leads and the standard inner leads are arranged in the same plane and both are arranged along one side of the semiconductor chip. Clearance between the inner leads and the die pad larger than the total thickness of the semiconductor chip and the bonding material. Thus, a semiconductor chip having electrode pads broadly distributed can be employed and the section modulus of the semiconductor package can be increased.

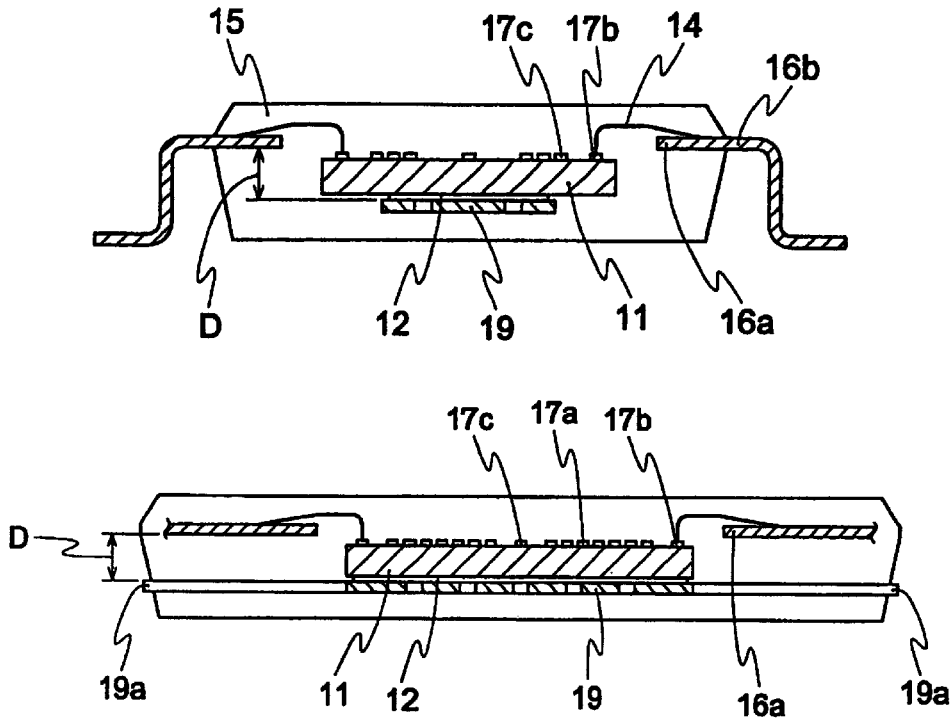

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

THE DRAWING FIGURES HAVE BEEN CHANGED AS FOLLOWS:

Reference numeral "17a" has been corrected to read "17c"; 17c now agrees with the specification's description of "distributed electrode pads".

AS A RESULT OF REEXAMINATION, IT HAS BEEN DETERMINED THAT:

Claims 2 and 6 are cancelled.

Claims 1 and 3–5 are determined to be patentable as amended.

New claims 7 and 8 are added and determined to be patentable.

1. A *packaged* semiconductor [package] *device* comprising:
a *rectangular* semiconductor chip *including two longer sides and two shorter sides*,
a die pad,
a die bonding material fixing *a rear surface of* the semiconductor chip to the die pad,
lead-on-chip (LOC) inner leads having tips spaced from and extending across *part of a front surface of* the semiconductor chip,
standard inner leads *having tips extending toward but not reaching the semiconductor chip*,
*electrode pads on the front surface of the semiconductor chip and including*
*central electrode pads located along a line generally centrally located on the front surface of the semiconductor chip, and generally parallel to one of the sides of the semiconductor chip,*
*peripheral electrode pads located along the respective pairs of longer and shorter sides of the semiconductor chip, and*
*distributed electrode pads located between the central electrode pads and the peripheral electrode pads,*
respective metal wires connecting the tips of the LOC inner leads to *respective central electrode pads and respective distributed* electrode pads on the semiconductor chip and *connecting the* tips of the standard inner leads to *respective peripheral* electrode pads on the semiconductor chip,
a sealing resin encapsulating the semiconductor chip, the die pad, the tips of the LOC and the standard inner leads, and the metal wires, and
respective outer leads extending successively from the LOC inner leads and the standard inner leads and protruding outwardly from the sealing resin, wherein the LOC inner leads and the standard inner leads are co-planar *within the sealing resin, wherein*
*a clearance between the LOC inner leads and the die pad is larger than total thickness of the semiconductor chip and the die bonding material, and*
*the ends of the die pad protrude from the sealing resin in a first plane and the outer leads protrude from the sealing resin in a second plane, spaced from the first plane by the clearance.*

3. The *packaged* semiconductor [package] *device* of claim 1, wherein [the] *both* LOC inner leads and [the] standard inner leads are [both] arranged along at least one [side] *of the longer and shorter sides* of the semiconductor chip.

4. The *packaged* semiconductor [package] *device* of claim 1, wherein [the] *only* LOC inner leads are arranged along a first [side] *of the sides* of the semiconductor chip and [the] *only* standard inner leads are arranged along a second [side] *of the sides* of the semiconductor chip.

5. A *packaged* semiconductor [package] *device* comprising:
a semiconductor chip,
a die pad,
a die bonding material fixing *a rear surface of* the semiconductor chip to the die pad,
lead-on-chip (LOC) inner leads having tips spaced from and extending across *part of a front surface of* the semiconductor chip,
standard inner leads *having tips extending toward but not reaching the semiconductor chip*,
respective metal wires connecting the tips of the LOC inner leads to electrode pads on the semiconductor chip and *connecting the* tips of the standard inner leads to electrode pads on the semiconductor chip,
a sealing resin encapsulating the semiconductor chip, the tips of the LOC and [the] standard inner leads, and the metal wires, and
respective outer leads extending successively from the LOC inner leads and the standard inner leads and protruding outwardly from the sealing resin, wherein
a distance between upper surfaces of the outer leads and an upper surface of the sealing resin is different from a distance between lower surfaces of the outer leads and a lower surface of the sealing resin,
*a clearance between the LOC inner leads and the die pad is larger than total thickness of the semiconductor chip and the die bonding material,* and
ends of the die pad are exposed at opposed side surfaces of the sealing resin and lie in a *first* plane parallel to *and spaced by the clearance from* a *second* plane in which the outer leads protrude *from the sealing resin*.

7. *The packaged semiconductor device of claim 1, wherein the die pad includes a plurality of through holes.*

8. *The packaged semiconductor device of claim 5, wherein the die pad includes a plurality of through holes.*

\* \* \* \* \*